United States Patent [19]

Mohr et al.

[11] 4,056,770

[45] Nov. 1, 1977

[54] DYNAMO ELECTRIC MACHINE PERMANENT MAGNET FLUX TEST APPARATUS WHICH SIMULATES ACTUAL FLUX CONDITIONS OF THE MOTOR

[75] Inventors: Adolf Mohr, Buhlertal; Wolfgang Sohn, Buhl-Vimbuch; Georg Strobl, Buhl, all of Germany

[73] Assignee: Robert Bosch GmbH, Stuttgart, Germany

[21] Appl. No.: 726,874

[22] Filed: Sept. 27, 1976

[30] Foreign Application Priority Data

Sept. 25, 1975  Germany ............................ 2542774

[51] Int. Cl.$^2$ ............................................. G01R 33/12
[52] U.S. Cl. ................................... 324/205; 361/148
[58] Field of Search .............. 324/34 R, 34 PE, 34 H, 324/42, 43 R, 45, 47, 158 MG; 335/184; 361/143, 147, 148

[56] References Cited

U.S. PATENT DOCUMENTS

| 3,417,295 | 12/1968 | Littwin | 335/284 |
| 3,488,575 | 1/1970 | McIntire et al. | 324/34 R |
| 3,971,054 | 7/1976 | Jasinski | 335/284 |

OTHER PUBLICATIONS

Tyler, P. M., A Method for Testing Magnets of Simple Shape; J. Scien. Inst. 1962, vol. 39, pp. 630-632.
Barta, G.T., Hall Probes Improve Magnet Testing, Electronics Nov. 16, 1962; p. 66.
DeMott, E. G., Integrating Fluxmeter with Digital Readout, IEEE Trans. on Mag. vol. May 6, No. 2, June 1970, pp. 269-271.
Nix et al., Magnetick, Institute für Magnetck U. Messtesknik; Apr. 1974, pp. 17-21.

*Primary Examiner*—Robert J. Corcoran
*Attorney, Agent, or Firm*—Flynn & Frishauf

[57]  ABSTRACT

To test the flux of circular segmental permanent magnets for assembly in permanent magnet dynamo electric machines, typically electric motors, a gauge is made of soft iron having an inner segmentally circular soft iron core, on it a layer of non-magnetic material to simulate the air gap of the motor, space for the permanent magnet to be inserted, and a return soft iron yoke in magnetic circuit with the core. A measuring coil which is chorded is located on the gauge to sense the magnetic flux, and so placed on the core that it conforms, at least approximately, to the pitch angle of the armature winding of the dynamo electric machine with which the magnet is to be used. To simulate cross fields, a demagnetization widing can be placed in the space adjacent the layer of nonmagnetic material adjacent the ends of the space for the permanent magnets to be tested, or the core can be cut with grooves similar to the coil slots of the armature, with current being passed therethrough in a direction to simulate the armature cross field. The test apparatus can be combined with a magnetizing yoke carrying magnetization coils to magnetize the segments, test them, and then demagnetize the segments, and reversely magnetize them for test of uniformity. Magnetic sensors can be placed on the core to sense the localized flux distribution of the magnetized magnet elements.

14 Claims, 4 Drawing Figures

DYNAMO ELECTRIC MACHINE PERMANENT MAGNET FLUX TEST APPARATUS WHICH SIMULATES ACTUAL FLUX CONDITIONS OF THE MOTOR

CROSS REFERENCE TO RELATED APPLICATION

U.S. Ser. 723,315, filed Sept. 15, 1976, Sohn & Mohr assigned to the assignee of the present application.

The present invention relates to an apparatus to test flux density and remanence of arcuate permanent magnet segments for use in dynamo electric machines, and more particularly in electric motors, by using a soft iron gauge which can be coupled to the magnets.

Gauges have been proposed which, in general, are of semicircular cross section; they have a soft iron core and a return yoke. Such known measuring devices are provided with an air gap, that is, the core of the gauge is spaced from the magnetic segment in order to obtain homogeneous flux distribution in the air gap, and to permit a single field strength measurement from which the flux of the magnetic segments can be derived. The magnetic segment is surrounded by soft iron which, due to its high permeability in comparison to the magnetic material, effectively provides magnetically equal-potential surfaces for the magnetic material. Magnetic segments are frequently so made that the edges of the magnets are made with decreasing thickness in order to decrease motor noise. The soft iron gauge, however, due to its characteristic, also equalizes the magnetic potential at the ends of the magnet segments as well as/at the center portion. Due to the equalization of the field, parasitic compensation fluxes will arise at localized zones of greater thickness of the magnet with respect to thinner zones of the magnets, in accordance with the principle of parallel connected magnets. These compensation fluxes are not measured. Tests results obtained from the magnets thus differ from the actual magnetic flux in operation. Further, when the magnet is assembled into a motor, it is located directly exposed to the air gap, so that its surface does not form an equal potential magnetic surface, and its flux lines no longer necessarily pass vertically through the magnet. This additionally changes the action of the magnet in the motor with respect to its behavior when being tested. This leads to rejects during testing of magnets which are perfectly suited for assembly in a motor, and acceptance of magnets which, however, are not suitable for motor assembly.

It is an object of the present invention to provide a magnetic testing gauge for magnets for use in dynamo electric machines, and more particularly in electric motors which are bowed or arcuate, and form cylindrical segments, and which permits accurate simulation of the actual flux distribution of the magnet, that is, the condition of the magnetic field when it is assembled in a motor, so that the test will provide accurate data regarding the operation of the magnet in a motor. The guage should, further, be simple, inexpensive and easy to use.

SUBJECT MATTER OF THE PRESENT INVENTION

Briefly, the air gap in the motor is simulated by a layer or insert of nonmagnetic material of a thickness simulating the thickness of the air gap; the flux is measured by means of a chorded measuring coil, the position of which on the gauge corresponds, at least approximately, to the pitch angle of the armature of the motor.

Non-magnetic material simulating the air gap thus is located immediately adjacent the magnet; the field distribution thus is similar to that in the actual motor, since the non-magnetic material permits the same field relationship to exit as in the actual motor. Low compensation magnetic flux lines will arise in the space of the air gap. Since the non-magnetic material corresponds to the air gap when the segment is in actual use ina motor, the field is no longer necessarily homogeneous. The flux no longer can be measured, as before, by pure field strength measurement, for example by means of Hall sensors, under static conditions. Rather, a chorded measuring coil is used in which flux change upon relative movement of the magnetized segment and the measuring guage will induce a voltage, the time integral of which is a measure for the field strength. In order to further simulate the conditions of a motor, the measuring winding or coil is so arranged that it corresponds to the pitch of the motor armature windings; the sensing winding, thus, is located in the position corresponding to those coils of the armature winding, the flux linkages of which cause the torque of the motor.

Tests with the apparatus herein described and claimed have shown that the error rate could be decreased from about 12%, of prior art structures, to about 1 to 2% with structures in accordance with this application.

In order to even further approach the field conditions of the magnet in a motor structure, the gauge is so dimensioned that its outer diameters also match the dimensions of the motor magnet return yoke and the dimensions of the armature.

The layer or sheet of non-magnetic material is best formed as part of the guage itself, so that additional parts need not be handled during the testing steps and no elements can get lost. To permit rapid indication of flux value, the measuring coil and the volt meter are preferably connected over an integrator.

In accordance with a feature of the invention, the influence of the cross field of the motor during operaton can also be considered by locating additional windings on the guage which are suitably energized to provide localized fields therein so that their effects on the magnet segment to be tested can be checked The invention will be described by way of example with reference to the accompanying drawings, wherein.

Figure 1:
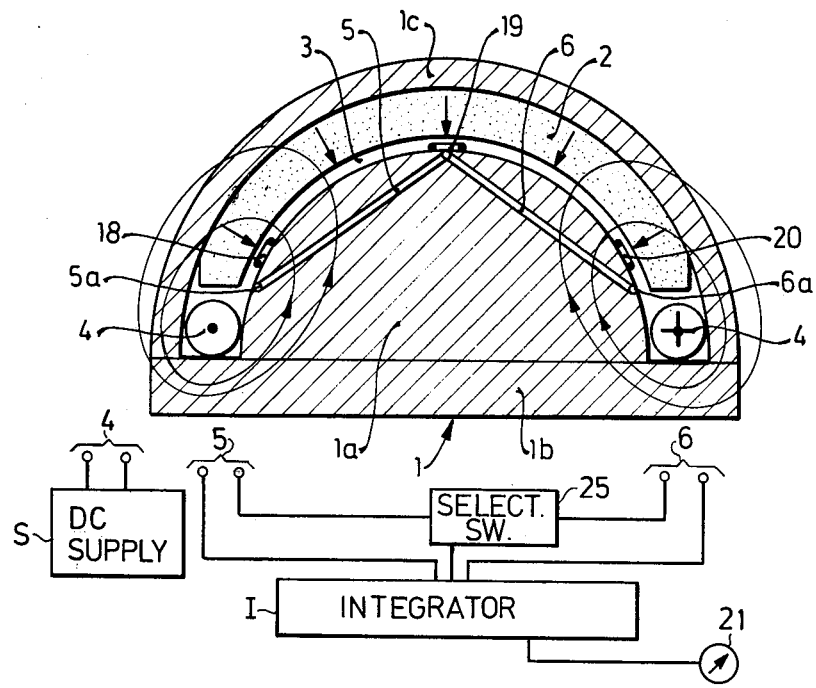
FIG. 1 is a schematic cross-sectional view through the gauge for testing an essentially semi-circular magnetic element having cross field compensation windings.

The gauge 1 (FIG. 1) is of approximately semi-circular cross section and has a core 1a, a return yoke 1c and a bridge 1b to connect the return yoke 1c to the core 1a. A gap of arch shape is left between the yoke 1c and the core 1a in which the magnet segment 2 to be tested can be inserted by sliding it into the gauge. The longitudinal surfaces of the magnet segment 2 slide on the gauge. The depth of the slit is so dimensioned that the entire axial length of the magnet segment 2 can be inserted in the guage.

The core 1a is covered with a layer 3 of non-magnetic material at the convex surface thereof, that is, the surface facing the magnet segment 2. The thickness and location of the layer 3, which is in sheet form, corresponds in its dimensions to the air gap of the motor and simulates the air gap in the gauge. This is necessary since, otherwise, the segment 2 would not be reliably positioned in the gauge. At the two longitudinal edges of the segment, the non-magnetic material is widened to extend to the entire width of the slit up to the return yoke 1c, corresponding to the field pole gaps of the motor. The return connection for magnetic flux between the yoke 1c over base 1b to the core 1a must, of course, be retained. The non-magnetic material is matched at least approximately to the shape of the magnet segment 2.

A counter field coil 4 is located in circumferential direction in the region of the non-magnetic material 3 at the ends of the magnets, as seen in FIG. 1. This coil is connected to a source S of direct current supply and so poled that the magnetic field of the counter field is opposed to the magnet segment 2, thus simulating the cross field.

Magnetic flux in core 1a is measured by a two-part measuring coil 5, 6, the parts of which can be selectively connected by selector switch 25, as follows: (1) coils 5 and 6 in series; (2) coil 5 alone; (3) coil 6 alone; (4) coils 5, 6, in parallel. The coils, through the selector switch 25, are connected to an integrator I which is connected to a measuring instrument 21. The two axially extending portions of the coil parts 5a, 6a are located on the core 1a to correspond in their position to the coils of the armature of the motor and will have the same pitch or pitch angle as the armature winding of the motor, so that the flux being sensed is that one which is primarily effective to cause the torque generated by the motor.

Operation and test steps, with reference to FIG. 1:

First test: The magnetized magnetic segment 2 is slid axially into the space therefor in the gauge 1; the two coil parts 5, 6 are serially connected by placing switch 25 in "serial" position. Thereafter, the segment is pushed out from the guage by means of a slider (not shown). The field to which the coil portions 5 and 6 are exposed will change, thus inducing a voltage therein. The time integral of the voltage is a measure for the strength of the magnetic flux. This time integral can readily be sensed by well-known integrating elements, such as R/C circuits in integrator I. The time integral of the voltage in the coil portions is independent of the speed of movement. If this flux is above the desired value, then the second test can be commenced.

Second test: This test checks if the segment 2 has sufficient remanence with respect to the demagnetizing cross fields arising in motor operation if the segment is assembled in a motor. D-C supply S is energized to place current in the cross field simulating coil 4, generating a magnetic field which in its strength corresponds to that of the demagnetizing armature cross field. The remaining flux is then measured by changing switch 25 to interrupt the series connection of coils 5 and 6; switch 25 is then placed into the second position (coil 5) to test the field to be read off indicator 21 when the segment 2 is again removed from the gauge. The step is repeated with the switch 25 set to connect the coil 6 to the integrator I and then to the meter 21. This tests the ends of the segment 2 separately; these ends are particularly subject to the demagnetizing cross field.

Figure 2:
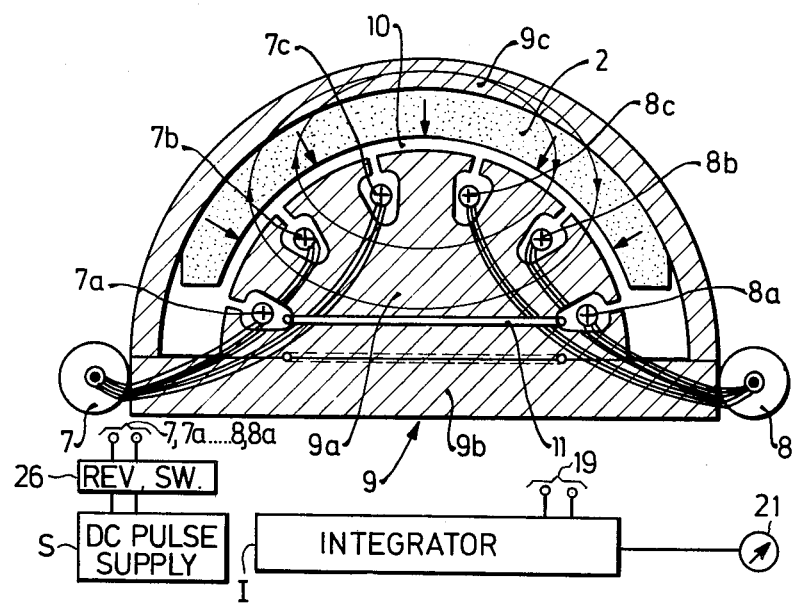
FIG. 2 is a transverse cross-sectional schematic view in which cross field windings are located in grooves radially inwardly of the non-magnetic layer or sheet.

Embodiment of FIG. 2: The gauge closely simulates the armature, and particularly the armature cross field. As can be seen from the flux lines of the cross field coil 4, both magnet ends are subject to a decreasing magnetization. In actual motor operation, however, only the trailing edge is weakened, the leading edge, however, being subjected to a field which is in the same direction as the fixed field, to enhance or aid the fixed field. Thus, a test for remanence in the arrangement of FIG. 1 does not simulate motor operation. Not only one edge, but the entire segment, is subjected to a cross field tending to weaken the field from the permanent magent. Segments can be indicated to be not suitable which, however, would be useful in motors operating in only one direction, since in those motors only one end or edge of the segment 2 is subjected to a demagnetizing field.

In the embodiment of FIG. 2, therefore, the cross field is obtained by simulating the armature current and providing a field which is directed in the same direction throughout, so that the field at one of the segment is enhanced, whereas the other is decreased. This requires connecting the cross field conducctors to the power supply by return lines outside of the flux field. The return conductors 7, 8 in FIG. 2 are thus located outside of the gauge to return current to the power supply S. To match the cross field even better to that actually generated in a motor, a plurality of counter or cross field conductors 7a, 7b, 7c; 8a, 8b, 8c are located in grooves in the core 9a of the gauge 9, the grooves simulating the coil slots in which the armature windings are positioned, and being similarly placed. Thus, the armature cross field can be accurately simulated.

The longitudinal grooves in which the cross field conductors 7a, 7b, 7c; 8a, 8b, 8c are placed are located at the convex side of the gauge just beneath the layer or sheet of non-magnetic material; they are externally connected with the return conductors 7, 8, respectively. Core 9a as well as the base 9b thus simulate half of an armature lamination package with coil slots.

The return magnetic yoke 9c as well as the layer 10 of non-magnetic material correspond, essentially, to that of the arrangement in FIG. 1. A single chorded winding 11 forming the sensing winding can be used and located, for example, in the grooves of conductors 7a, 8a and preferably at the bottom of the groove. Two windings, similar to those used in FIG. 1, could also be employed.

Operating and test steps: The magnetized magnet segment 2 is slid into the gauge. The cross field windings 7, 7a, 7b, 7c and 8, 8a, 8b, 8c are connected to the d-c supply S which, preferably, is a pulse supply, to effect demagnetization at one segment edge. The supply S is then disconnected and the segment 2 removed from the gauge by sliding it outwardly; the remaining flux is measured by coil 11 connected to integrator I which, in turn, is connected to the indicator 21. Since the position of the magnet in the motor is not fixed or determined at this time with respect to the direction of rotation of the motor, the process is repeated at the other edge. This requires a new remagnetization of the segment since the motor tends to demagnetize only one edte. If both flux values are above the acceptable value, then the magnet can be inserted in any position in the motor; otherwise, it can be used only in one position, inserted in a motor having only one direction of rotation.

The test for overall flux is carried out similarly to the first test step explained in connection with FIG. 1.

Figure 3:
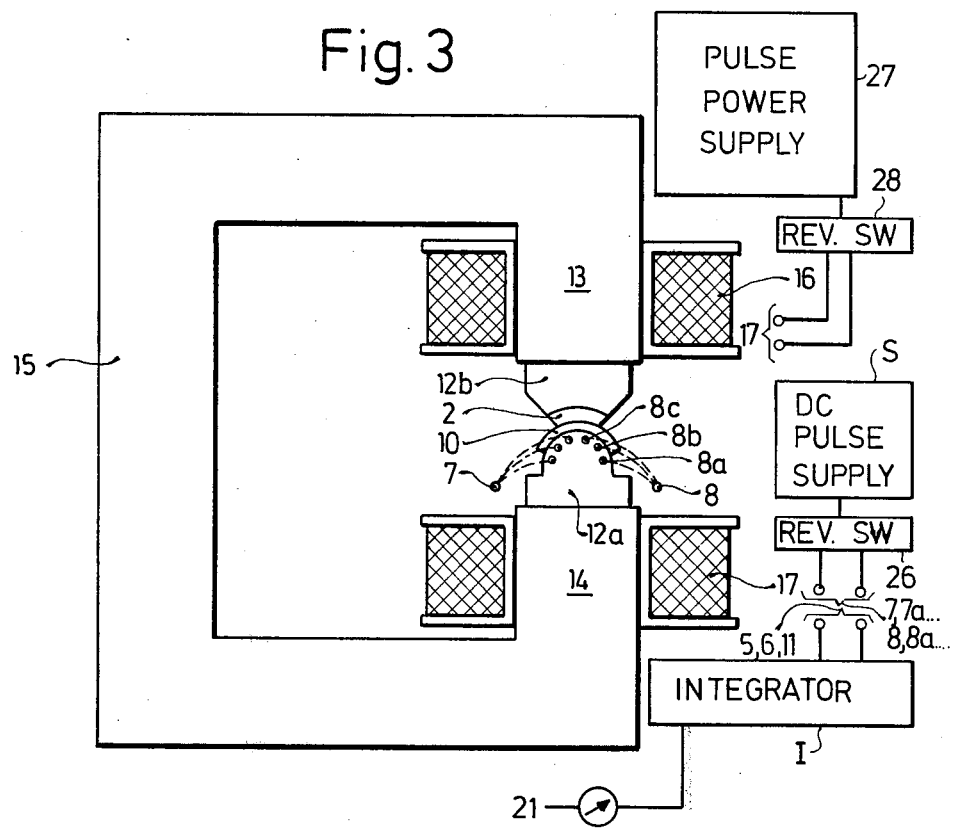
FIG. 3 is a schematic illustration of a combination of a magnetizing yoke and a measuring system.

Embodiment of FIG. 3: This is a particularly advantageous embodiment; the gauge 12 has an interrupted magnetic return path. It consists of two pole shoes 12a, 12b which are assembled to the poles 12, 14 of the magnetizing yoke 15. The two pole shoes are made essentially of soft iron and their interior construction is essentially similar to the arrangement of FIG. 2, although the arrangement of FIG. 1 could also be used and measuring coils 5, 6 or a single measuring coil 11 could be employed. The measuring coils have been omitted from FIG. 3 for clarity. The end connections of the cross field conductors from the coil portions 7a, 7b 8a, 8b to the return conductor 7, 8 are shown in broken lines.

Poles 13, 14 are surrounded by electromagnet coils 16, 17, so that the magnet segment 2 can remain in the gauge during the magnetizing steps, during demagnetizing steps, as well as during test steps.

A power supply, preferably pulse power supply 27, is connected through a reversal switch 28 to the coils 16, 17. D-C pulse supply S is connected through a reversal switch 26 to the cross field conductors. Reversal switch 26 is also shown in FIG. 2 where it may be used.

Operation and test steps: The magnet segment 2 to be tested is introduced between pole shoes 12a, 12b of the combination gauge and magnetizing apparatus in unmagnetized condition. By energizing power supply 27, segment 2 is first magnetized in a desired direction to a desired level. Thereafter, the armature cross field is simulated, as discussed in connection with FIG. 2, by first reducing the magnetic field at one edge and increasing it at the other and then measuring the remaining flux. The reversal switch 26 is then operated and the cross field reversely poled, and the measuring step repeated for the other edge of the segment.

Figure 4:
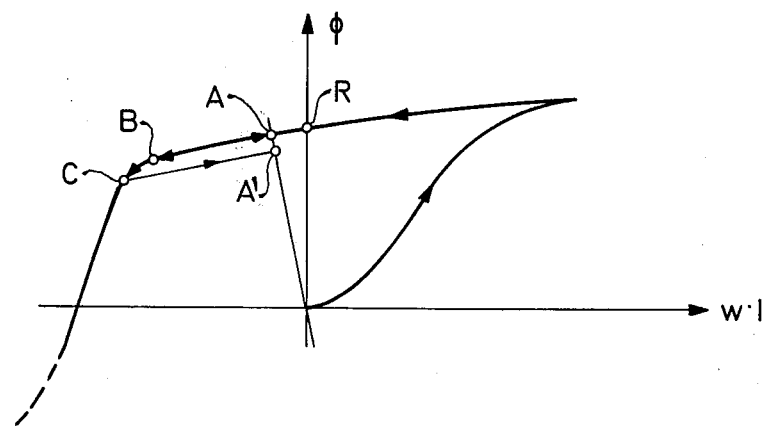
FIG. 4 is a graph showing magnetic flux (ordinate) with respect to magnetization current.

The segment 2 need not be removed from the gauge during the magnetization and demagnetization steps; thus, the measuring output will not depend on relative movement between the segment and the gauge, and it is therefore desirable to provide a measuring output which is independent of such movement. The flux change which occurs upon magnetization and partial demagnetization can be use to induce a voltage in the respective coils 5, 6 or 11, as used. The entire wave of induced voltage from magnetization to change of the magnetic field by the armature cross field is thus sensed. The time integral of this voltage, after disconnecting of the armature cross field, then corresponds to the remaining remanent flux of the magnetic segment. This will be explained in connection with FIG. 4:

FIG. 4 shows the magnetic flux curve with respect to magnetization current. Upon magnetizing, the magnetic flux will follow the well-known start of the hysteresis curve to approximately saturation. After the magnetization current decays, a remanent magnetism at point R will remain. Due to the air gap, the actual flux will be somewhat less than the remanent flux and the working point A will be obtained. If the armature cross field is connected, the flux will still decrease. For a magnet segment of good quality, the decrease will extend to point B at the most. Upon disconnection of the armature cross field, the flux will return to the working point A along the slope of the curve at A. Thus, the original working point is reached, or at least reached approximately. Since the induced voltage during the entire field change is integrated and recorded as an integral, the integral value will correspond to the remaining flux, although it may have, temporarily, decreased..

Magnet segments of poor cross field stability will have flux at a point below the knee of the curve, for example at point C. After disconnection of the cross field, the working point will again change forward at the slope of the hysteresis curve at point A; due to the drop below the knee of the curve, the return point will be A', which is clearly less than point A and leads to a correspondingly lower output measured value when the voltage is integrated.

The cross field can be changed beyond that actually occurring in the motor under normal operating conditions to also test the segments with respect to the influence of low temperatures.

The magnetization step and the cross field generation are preferably carried out with pulsed d-c. The field is then not built up at one single pulse but over various periods. This decreases the loading on the power supply. The main field and the cross field can be connected, disconnected and re-connected in dependence on current, thus permitting very close adjustment of the armature cross field, independent of temperature of the windings and of voltage variations.

Motors which should operate at particularly low noise levels should have uniform flux distribution throughout the entire magnet segment. It is therefore important to test such segments also for uniformity of flux over the circumferential dimension of the segment, and particularly to sense depressions or projections in the flux distribution curve. To sense localized flux distribution, additional sensors can be provided at the circumference of the gauge. Such sensors 18, 19, 20 have been shown in FIG. 1, although they can be used also in the embodiment of all the other figures; they may be statically operating Hall sensors, as well as dynamically operating small sensing coils. Their output is then connected to separate integrators and measuring instruments or memories for sequential indication of test results.

The structure permits measuring of magnetic flux values which are actually closely simulating conditions of the magnets when assembled into an operating motor since they are capable of closely matching actual motor operating conditions. The arrangement of FIG. 3 has the additional advantage of being particularly simple in use so that it can be used as a magnetizing apparatus and can be readily combined with an automatic test system having automatic placement of the test magnets 2 with GO/NO-GO output.

The cross field which occurs in motors is strongest when the motor is operating under starting conditions, particularly when starting under load. If the armature cross field is high, the trailing edge of the magnet can be irreversibly demagnetized. The guage thus permits testing not only for absolute magnetic flux generation, but further for remanence in the presence of demagnetizing fields. The cross field simulating coils can be suitably energized and dimensioned and, in accordance with the embodiment of FIG. 1, provide outputs which test both sides of the magnet segments, for example for magnets in which the placement in a motor is random, or for magnets to be placed in motors with reversible direction of rotation. Rejects in which only one edge is defective, however, need not be rejected for use in motors since, if one edge is good, as determined by the tests in accordance with FIGS. 2 or 3, the segment can be so assembled in a motor that that end of the segment which has high remanence is placed at the trailing side. This also prevents irreversibly weakening of the segment at the measuring step. When assembled in a motor, the cross field which acts locally against one end of the segments only would not cause demagnetization of the end of the magnet which is weaker and placed at the leading side where, on the contrary, motor operation will tend to enhance magnetic strength. Particularly in multi-component magnets, in which the ends of the segments are made of material of high coercivity, the segment may be demagnetized primarily in the center portion during the test whereas, in a motor, only one of the two ends of the segment is actually subjected to a demagnetizing field. The embodiment of FIGS. 2 and 3, in which the grooves of demagnetizing windings are placed to correspond essentially to the coil slots of the armature with which the segment is to be used prevent such erroneous test results. Rejection of magnet segments which should test GOOD is thereby avoided. The magnetic flux applied by the cross field simulating winding in accordance with FIG. 2 rises linearly from the center of the segment to one segmental end and decreases towards the other segmental end, and thus, by suitable selection of the cross field strength, corresponds exactly to the actual armature cross field generated in the motor. The gauge is preferably so constructed that the winding grooves match exactly the coil slots of the armature with which the magnet segment 2 is to be used.

The direction of current flow in the cross field windings 7a, 7b 8a, 8b can be reversed by switch 26 connected between the d-c pulse supply S and the respective windings. This permits testing of both ends of the segments for incorporation in motors, for example, capable of operating in two directions or for assembly in motors in which the direction of assembly is irrelevant. If both flux values, after the cross field has been energized, are above the desired value, then the magnet is GOOD for such universal application.

Most integrators have some drift. To prevent drift of the stored integral value to affect the measuring result, the segment is preferably completely demagnetized after testing one segment edge. This is particularly simple in the arrangement according to FIG. 3, where reversing the polarity of the power supply to the coils 16, 17, by operating switch 28, can effect total demagnetization. Thus, a definite starting point for new re-magnetization, to test the second edge of the segment, is obtained.

Various changes and modifications may be made, and features described in connection with any one of the embodiments may be used with any of the other, within the scope of the inventive concept.

We claim:
1. Dynamo electric machine permanent magnet test apparatus to test the magnetic flux emanating from part circular permanent magnet segment of arcuate cross section comprising
a guage (1, 9) which is at least partly cylindrical and of material having soft iron characteristics, including a smaller part cylindrical segmental portion (1a, 12a) adapted for placement within the arcuate magnet segment, and a larger arcuate part cylindrical portion (1c, 12b) adapted for placement outside of the arcuate magnet segment (2), means (1b, 13, 14, 15) magnetically connecting said smaller, inner portion and said larger outer portion to form a magnetic circuit structure having soft iron characteristics, and an opening coaxial with said portions, separating said portions and shaped to receive the magnet segment (2);
a layer (3, 10) of nonmagnetic material having a thickness simulating the air gap of the dynamo electric machine located adjacent one of said portions and facing said opening;
cross field simulating winding means (4; 7a, 7b, 7c; 8a, 8b, 8c) located on one of said portions of the gauge adjacent the ends, in circumferential direction, of the magnet segment (2);
means (S) energizing said cross field simulating winding means to establish a magnetic field simulating the cross field arising in operation of a dynamo electric machine;
a chorded measuring coil (5, 6, 11) located on the gauge to sense magnetic flux passing through the non-magnetic material simulating the air gap, the coil being positioned to conform at least approximately to the pitch angle of the armature of the dynamo electric machine in which the segmental permanent magnet (2) is to be used;
and measuring means including an integrator (I) and a volt meter (21) connected to the output of the integrator, the integrator being connected to the measuring coil (5, 6; 11) whereby the volt meter will read the time integral of voltage induced in the measuring coil upon change of flux linkages between the measuring coil and the magnet segment (2).

2. Test apparatus according to claim 1, wherein the smaller inner portion (1a, 12a) of the gauge comprises a core element having a convex outer surface on which said non-magnetic layer (3) is positioned;
and a cover element forming the larger, outer portion (1c, 12b) and having a concave inner surface fitting against the permanent magnet segment.

3. Test apparatus according to claim 1, wherein the smaller inner portion of the gauge comprises a core element (1a) having a convex surfaceon which said non-magnetic layer (3) is positioned, said core element (1a) having outer dimensions simulating and matching the magnetic path of the armature of the dynamo electric machine.

4. Test apparatus according to claim 1, wherein the layer (3, 10) of non-magnetic material is fixedly secured to the gauge.

5. Test apparatus according to claim 1 wherein said measuring coil comprises two similar coil portions (5, 6) symmetrically positioned on one of said gauge portions, with respect to the axis of symmetry of the magnet segment (2);
and switch means (25) are provided, connected to said coil portions and to said measuring means (I, 21) to selectively connect said coil portions, in series to the measuring means, or individually to the measuring means.

6. Test apparatus according to claim 1, wherein (FIGS. 2, 3) the smaller inner portion of the gauge (9) includes a plurality of axial, grooves located radially inwardly of said non-magnetic layer (10), the grooves being positioned to match the coil slots of the armature of the dydnamo electric machine;
the cross field simulating windings (7a, 7b, 7c; 8a, 8b, 8c) being located in said grooves and including return conductors (7, 8) located out of the magnetic flux field of the magnet segment (2);
and wherein the energizing means (S) are connected to said cross field simulating windings and the return conductors to energize said cross field simulating windings with current flowing therethrough in the same direction.

7. Test apparatus according to claim 6, wherein the non-magnetic layer (10) is located on the surface of the smaller inner portion said smaller portion being similar to a segment of the armature lamination stack of the dynamo electric machine, including the coil slots thereof.

8. Test apparatus according to claim 6, further comprising a reversal switch (26) between the energizing means (S) and the cross field simulating windings (7a-c; 8a-c) and the return conductors (7, 8) and providing for reversal of polarity of current being applied to the cross field simulating windings from said energizing means.

9. Test apparatus according to claim 1, including integrator means (I, 21) connected to the measuring coil and sensing and storing the time integral of the voltage induced in the measuring coil upon relative movement between the permanent magnet segment (2) and the coil.

10. Test apparatus according to claim 1, wherein (FIG. 3) the magnetic connection means comprises pole shoes (13, 14), secured to the respective gauge portions;

a magnetizing yoke (15) magnetically connected to the pole shoes, and wherein magnetizing coils (16, 17) are provided on the yoke, to permit magnetizing of the permanent magnet segment.

11. Test apparatus according to claim 10, wherein the integrating means (I,21) connected to the measuring coil senses the time integral of the voltage induced in the measuring coil upon magnetizing the permanent magnet segment (2) in the gauge.

12. Test apparatus according to claim 10, further comprising a power supply (27) connectable to said magnetizing coils for magnetizing the segment (16, 17) and reversal switch means (28) connected between the power supply (27) and said coils (16, 17) to permit reversal of polarity and demagnetization of the segment while positioned in the gauge.

13. Test apparatus according to claim 1, further comprising a plurality of field strength measuring means (18, 19, 20) distributed about said opening of the gauge in flux sensing relationship to the permanent magnet segment (2) being tested to check the localized flux distribution of the magnetic flux derived from said segment.

14. Test apparatus according to claim 4 wherein the integrating means (I, 21) connected to the measuring coil sense the time integral of voltage induced in the measuring coil upon relative movement between the measuring coil (5, 6; 11) and the magnet segment (2).

* * * * *